(12) United States Patent
Garner et al.

(10) Patent No.: US 7,552,758 B2
(45) Date of Patent: Jun. 30, 2009

(54) METHOD FOR HIGH-DENSITY PACKAGING AND COOLING OF HIGH-POWERED COMPUTE AND STORAGE SERVER BLADES

(75) Inventors: Robert Barton Garner, San Jose, CA (US); Winfried Wolfgang Wilcke, Los Altos Hills, CA (US)

(73) Assignee: International Business Machines Corporation, Armonk, NY (US)

( * ) Notice: Subject to any disclaimer, the term of this patent is extended or adjusted under 35 U.S.C. 154(b) by 665 days.

(21) Appl. No.: 10/977,159

(22) Filed: Oct. 29, 2004

(65) Prior Publication Data
US 2006/0090889 A1 May 4, 2006

(51) Int. Cl.
*H05K 7/20* (2006.01)
(52) U.S. Cl. .................. 165/80.4; 361/721
(58) Field of Classification Search ............ 165/80.4; 361/699, 721
See application file for complete search history.

(56) References Cited

U.S. PATENT DOCUMENTS

| | | | | |
|---|---|---|---|---|
| 3,334,684 A * | 8/1967 | Mazorol, Jr. et al. .......... | 165/47 |
| 4,884,167 A * | 11/1989 | Mine ......................... | 361/702 |
| 4,884,168 A * | 11/1989 | August et al. ................ | 361/702 |
| 5,057,968 A * | 10/1991 | Morrison ..................... | 361/700 |
| 5,131,859 A * | 7/1992 | Bowen et al. ................ | 439/194 |
| 5,901,036 A * | 5/1999 | Arz ........................... | 361/699 |
| 6,084,771 A * | 7/2000 | Ranchy et al. ............... | 361/699 |
| 6,091,603 A * | 7/2000 | Daves et al. ................. | 361/704 |
| 6,151,215 A * | 11/2000 | Hoffman ..................... | 361/704 |
| 6,381,137 B1* | 4/2002 | Kato et al. ................... | 361/704 |
| 6,393,853 B1* | 5/2002 | Vukovic et al. ............. | 62/259.2 |
| 6,853,554 B2* | 2/2005 | Bash et al. .................. | 361/699 |
| 2003/0147219 A1* | 8/2003 | Chou ......................... | 361/725 |
| 2005/0117303 A1* | 6/2005 | Nagahashi ................... | 361/704 |
| 2006/0011326 A1* | 1/2006 | Yuval ......................... | 165/80.4 |
| 2006/0065874 A1* | 3/2006 | Campbell et al. ........... | 251/348 |

* cited by examiner

*Primary Examiner*—Allen J Flanigan
(74) *Attorney, Agent, or Firm*—Kenneth L. Sherman, Esq.; Michael Zarrabian, Esq.; Myers Andras Sherman LLP

(57) ABSTRACT

According to the present invention, there is provided a system for removing heat from server blades densely packaged in a rack of server blades. The system includes a liquid distribution manifold. In addition, the system includes a plurality of cold blades attached to the liquid distribution manifold, wherein liquid is circulated through the liquid distribution manifold and the cold blades. Moreover, the system includes at least one server blade attached to each of the cold blades.

14 Claims, 9 Drawing Sheets

METHOD FOR HIGH-DENSITY PACKAGING AND COOLING OF HIGH-POWERED COMPUTE AND STORAGE SERVER BLADES

FIELD OF THE INVENTION

The present invention relates to computer cooling systems and, more specifically, to a system and method for providing the removal of heat from server blades densely packaged in a rack of server blades.

BACKGROUND OF THE INVENTION

Servers implemented as racks of full of blades (unpackaged printed circuit boards) are becoming increasingly popular because of their potentially high density. However, the difficulty of removing heat from such systems via forced air cooling has emerged as a very significant problem. It is so severe that in most actual datacenter installations blade server racks need to be kept half empty because they cannot be cooled with standard methods.

SUMMARY OF THE INVENTION

According to the present invention, there is provided a system for removing heat from server blades densely packaged in a rack of server blades. The system includes a liquid distribution manifold. In addition, the system includes a plurality of cold blades attached to the liquid distribution manifold, wherein liquid is circulated through the liquid distribution manifold and the cold blades. Moreover, the system includes at least one server blades attached to each of the cold blades.

DETAILED DESCRIPTION OF THE INVENTION

The invention describes a system and method for removing heat from server blades densely packaged in a rack of server blades.

Figure 1:
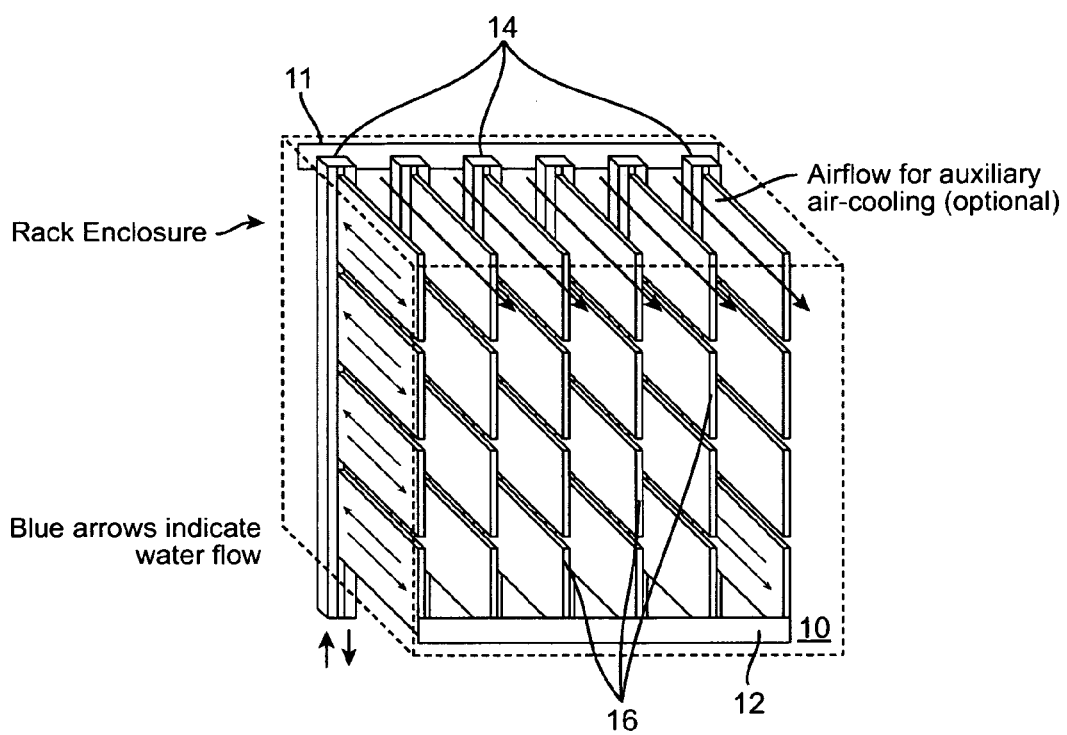
FIG. 1 shows the interior layout of a rack for iceblades.

FIG. 1 shows the interior layout of a rack for server blades (iceblades) within rack enclosure 10. Rack enclosure 10 includes a water distribution manifold including manifold columns 14, an upper portion 11 and a base portion 12. Multiple coldblades 16 can be attached to each of the manifold columns 14. Water flows horizontally through coldblades 16. The coldblades 16 are accessible from the front of enclosure 10. Airflow parallel to the coldblades 16 may be employed to remove residual heat which cannot be removed by the coldblades 16.

Figure 2:
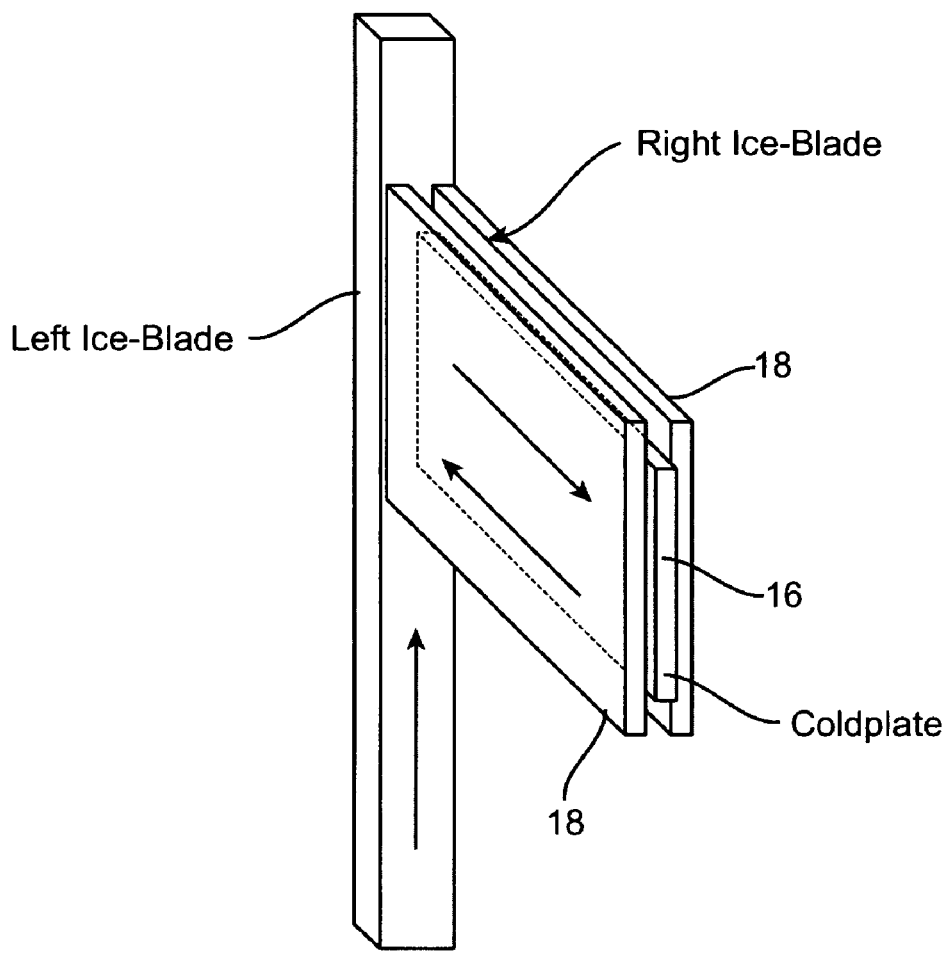
FIG. 2 shows two iceblades in close, direct thermal contact with a water-cooled coldblade.

FIG. 2 shows two iceblades 18 in close thermal contact with a coldblade 16. In one embodiment, the coldblade 16 is water-cooled. Each iceblade 18 is a carrier for electronic components. Each coldblade 16 is tightly embraced by two iceblades 18.

Figure 3:
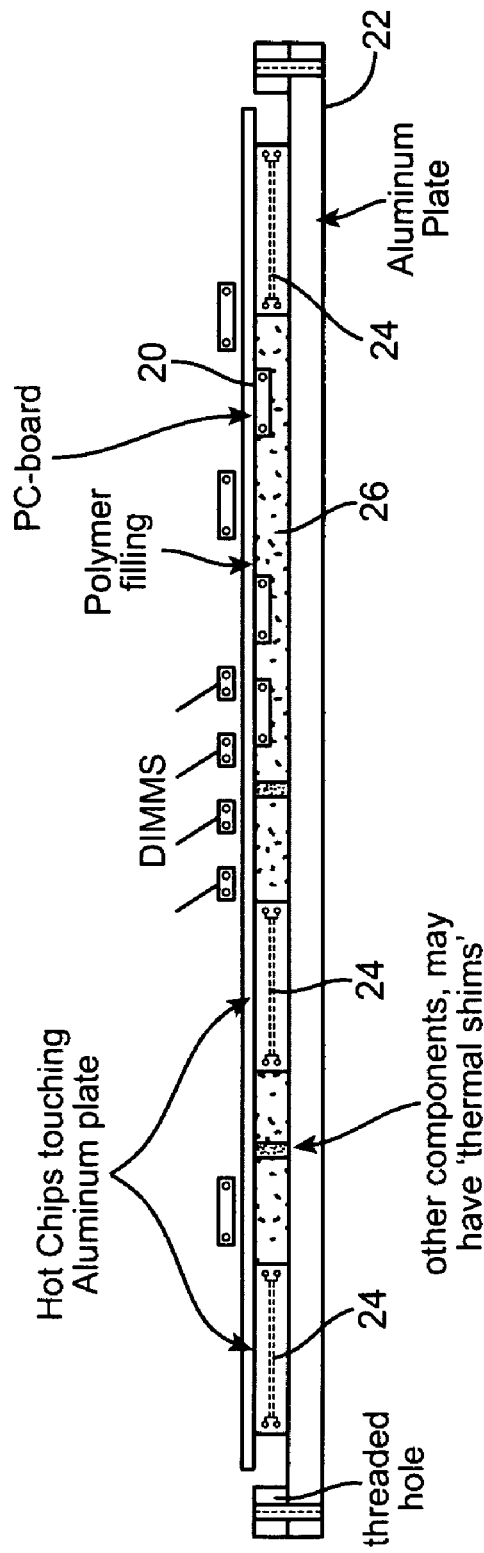
FIG. 3 shows the cross-section of a generic iceblade.

FIG. 3 shows a cross-section of an iceblade 18. In one embodiment, Iceblade 18 consists of printed circuit board 20 and heat-conducting metal plate 22. Major heat producing circuits (e.g., chips 24) on the printed circuit board 20 are in direct thermal contact with aluminum plate 22. Heat spreading methods of various kinds may be employed to carry heat from dissipating electronic elements to aluminum plate 22. In an exemplary embodiment, the space between printed circuit board 20 and aluminum plate 22 heat is filled with conducting polymer 26 or other materials, such as crushed copper wool. In another exemplary embodiment, metallic thermal shims may be used to carry heat form from dissipating electronic elements to aluminum plate 22. Also, heat dissipating elements (e.g., DIMMS) can be mounted on the backside of printed circuit board 20, where they are exposed to airflow.

Figure 4:
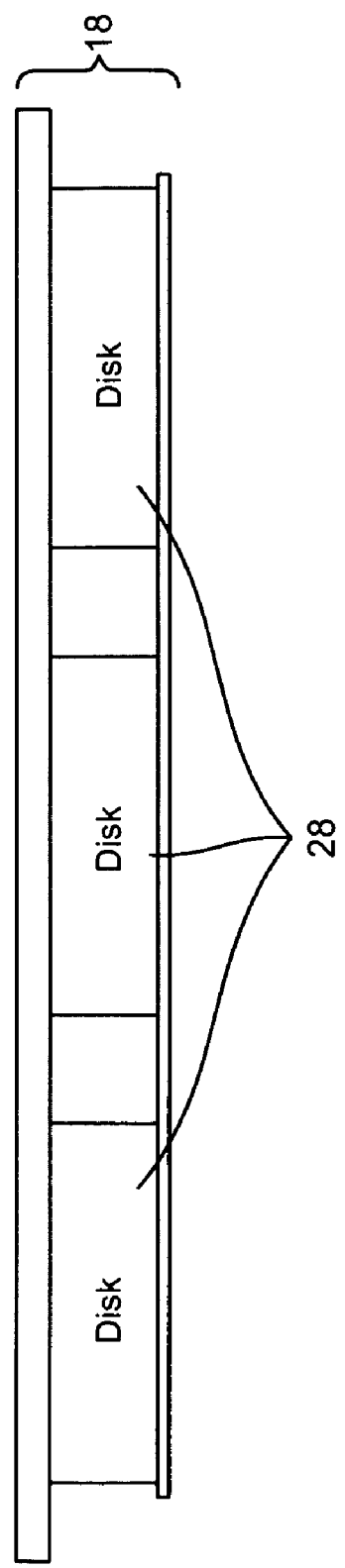
FIG. 4 shows the cross-section of an iceblade holding disks.

FIG. 4 shows a cross-section of an iceblade 18 holding multiple disks 28. The rigid surface of aluminum plate 22 makes it practical to rigidly mount disks 28. In contrast, conventional blades are typically unable to hold more than one or two disks 28.

Figure 5:
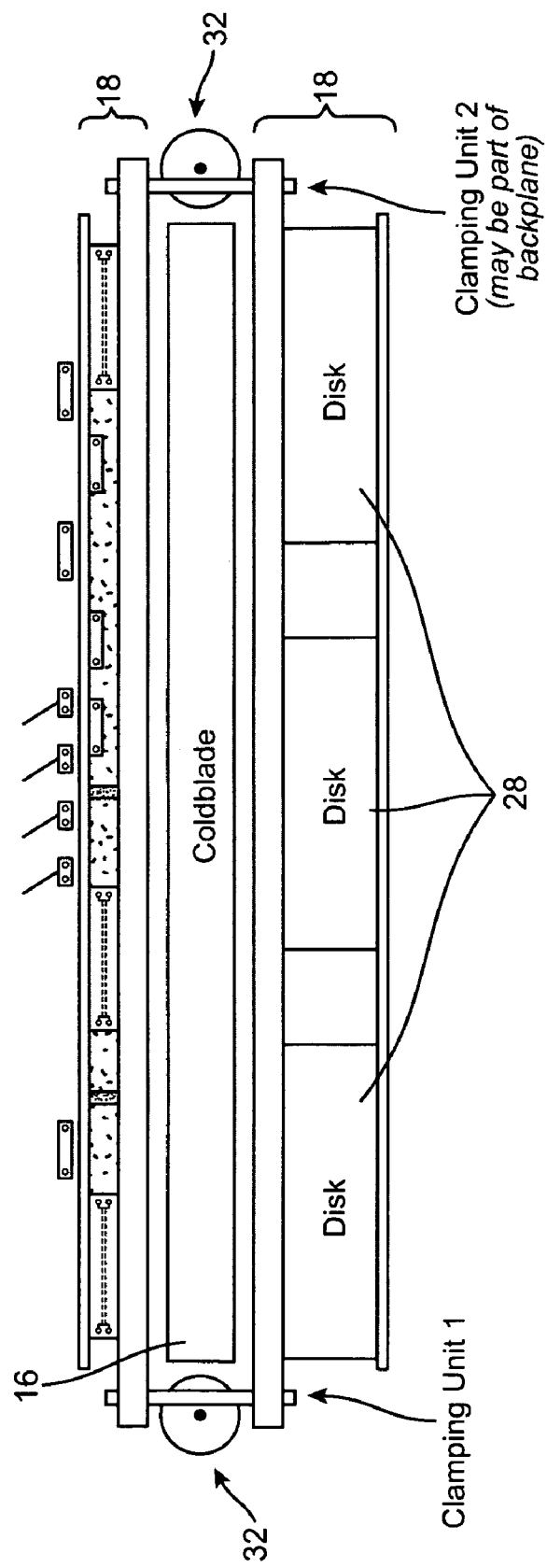
FIG. 5 shows a pair of iceblades, one diskless and one with disks, embracing a coldblade.

FIG. 5 shows one embodiment of a field replaceable unit (FRU) 30, consisting of a pair of iceblades 18, one diskless and one with disks 28, embracing a coldblade 16. A clamping mechanism automatically clamps the two iceblades 18 onto the coldblade 16 upon insertion. The clamping mechanisms includes clamping unit 32.

Figure 6:
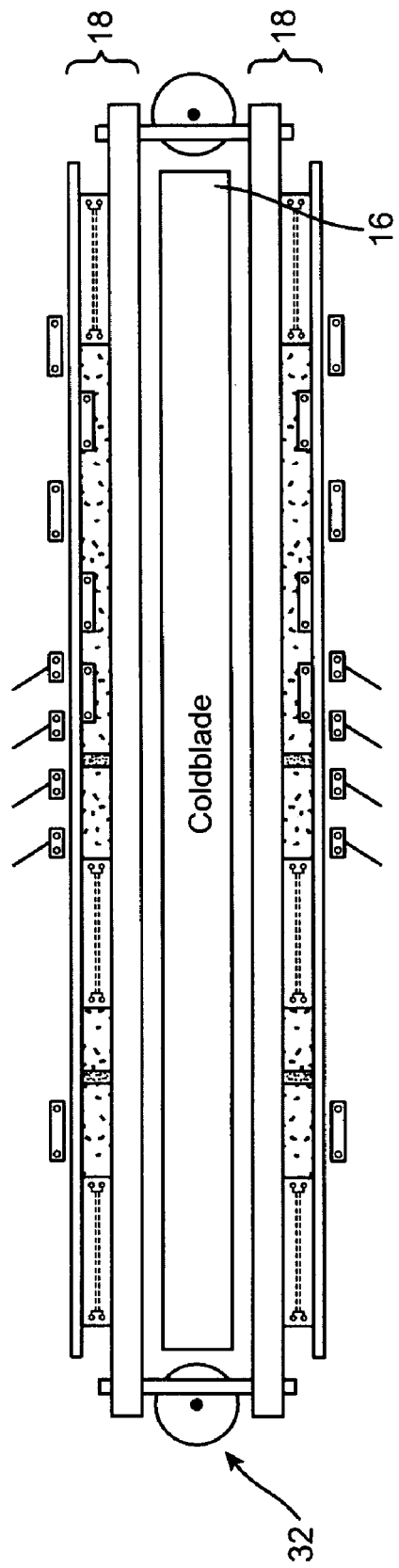
FIG. 6 shows two diskless iceblades embracing a coldblade.

FIG. 6 shows another embodiment of field replaceable unit (FRU) 30, consisting of a pair of diskless iceblades 18 embracing a coldblade 16.

Figure 7:
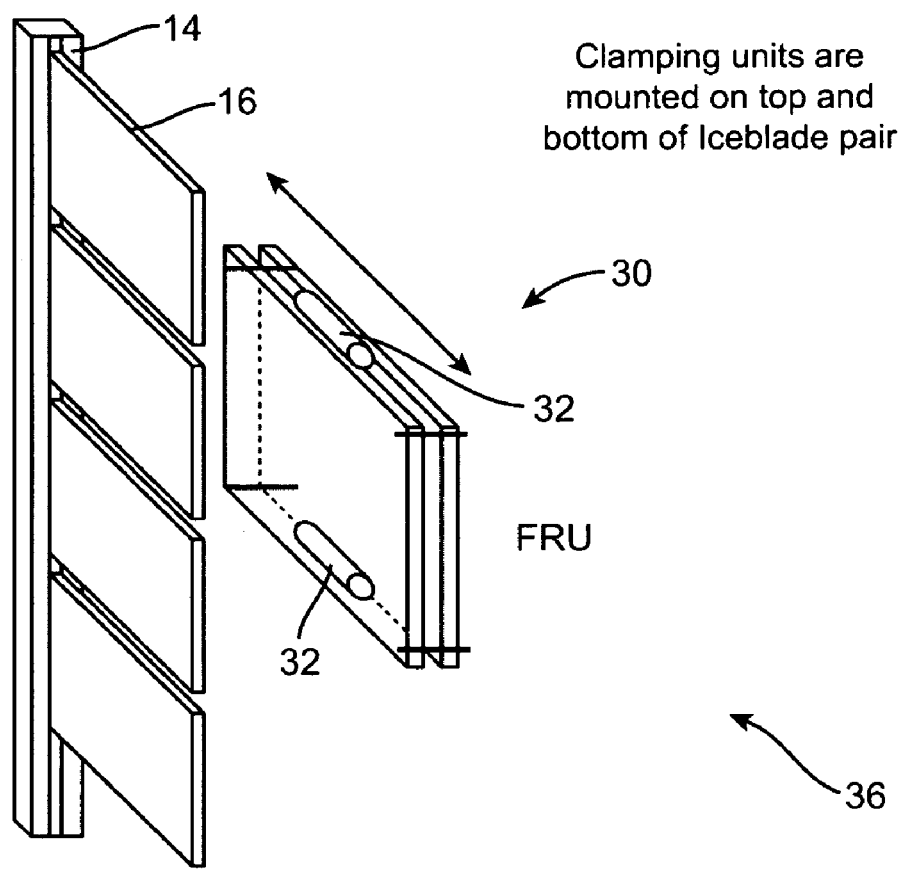
FIG. 7 shows the relative location of two clamps utilized in holding two iceblades together, where the iceblades surround a coldblade.

FIG. 7 is a diagram 36 showing the action associated with the insertion and removal of FRU 30 in conjunction with coldblade 30. In diagram 36, FRU 30 is shown with clamping unit 32 mounted on the top and bottom of FRU 30. In diagram 36, FRU 30 is inserted from the front of coldblade 16 towards manifold columns 14.

Figure 8:
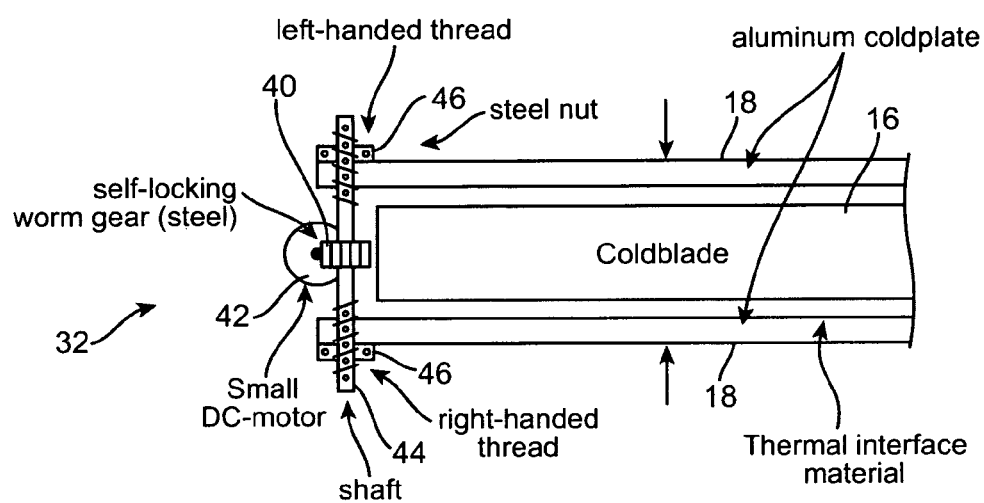
FIG. 8 shows a detailed view of the clamping mechanism utilized in holding two iceblades together, where the iceblades surround a coldblade, according to an exemplary embodiment of the invention.

FIG. 8 shows the details of an exemplary clamping unit 32 utilized by FRU 30. Clamping unit 32 includes self-locking worm gear 40, DC motor 42, shaft 44, steel nuts 46. DC motor 42 drives worm gear 40 through shaft 44. The ends of shaft 44 contain threads of opposite handedness (left handed and right handed, respectively) and engage nut 46 and nut 48. Nut 46 and nut 48 are each embedded in iceblades 18.

Application of DC voltage of one polarity to DC motor 42 will simultaneously draw iceblades 18 closer to coldblade 16. Application of the opposite polarity will drive iceblades 18 apart. In a DC motor 42, current draw and torque are nearly linearly related. This fact can be used to measure the applied torque and shut off the power when a pre-determined amount of torque or clamping force has been achieved.

Worm gear 40 is of self-locking design, where removing the voltage to the DC motor 42 will not result in a loosening of the clamping force. The axis of each DC motor 42 included in FRU 30 is extended to the front of the FRU 30 and fitted with a small handle. The small handle can be used to release FRU 30 in the event of the failure of DC motor 42.

Figure 9:
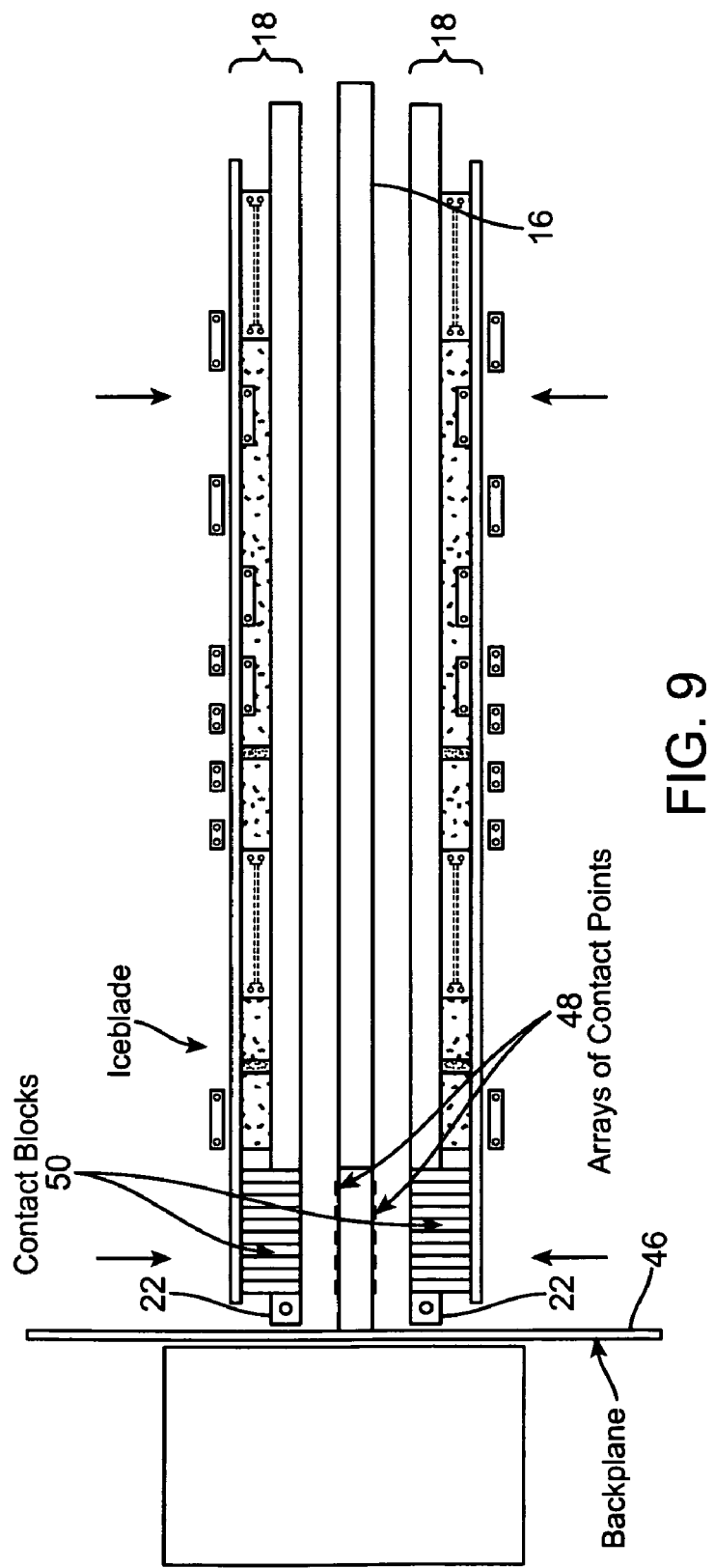
FIG. 9 is a diagram showing how iceblades make contact with a backplane, according to an exemplary embodiment of the invention.

FIG. 9 shows one embodiment of the contact mechanism utilized in rack enclosure 10, between iceblades 18 and backplane 46. Extending perpendicular from backplane 46 two arrays of contact points 48. Each iceblade 18 includes multiple contact blocks 50. Contact blocks 50 penetrate aluminum plate 22, so that they slightly protrude over the level of the mating surface of aluminum plate 22. The protruding contact blocks make contact with corresponding contact points 48. Clamping unit 32 provides the force necessary for contact between contact points 48 and contact blocks 50. In an alternative embodiment, capacitive coupling mechanisms can be employed as well.

Thus, a system, method and service to provide a cooling system for high-powered compute and storage server blades have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:

1. A system for removing heat from server blades, comprising:
   a server rack enclosure, the server rack enclosure enclosing:
      a liquid distribution manifold;
      a plurality of cold blades attached to the liquid distribution manifold,
   wherein liquid is circulated through the liquid distribution manifold and the cold blades; and
      at least one server blade attached to each of the cold blades,
   wherein the server blade includes a base portion, the base portion is a heat-conducting aluminum plate, the base portion is positioned directly onto the cold blade, and contact blocks penetrate the aluminum plate and make contact with corresponding contact points of the cold blades.

2. The system of claim 1, wherein the liquid distribution manifold comprises:
   a base portion; and
   at least one column ascending from the base portion.

3. The system of claim 2, wherein the cold blade is attached to the liquid distribution manifold at the at least one column.

4. The system of claim 3, wherein the server rack enclosure further comprising:
   a means for circulating the liquid through the base portion, the at least one column and each of the cold blades attached to the at least one column.

5. The system of claim 1, wherein the server blade comprises a printed circuit board.

6. The system of claim 1, wherein the server blade comprises at least one disk drive.

7. The system of claim 1, wherein heat producing elements within the server blade are in direct thermal contact with the base portion.

8. The system of claim 7, wherein the direct thermal contact is achieved via thermal shims.

9. The system of claim 7, wherein the direct thermal contact is achieved via filling the space via the aluminum plate and the heat producing elements with heat conducting polymers.

10. The system of claim 1, wherein heat producing elements are attached to the side of the server blade opposite of the side facing the cold blade, wherein airflow within the server rack enclosure is utilized to supplement heat dissipation achieved via the cold blade.

11. The system of claim 1, wherein two server blades are attached as a pair of server blades to each of the cold blades.

12. The system of claim 11, wherein each server blade of the pair of server blades is attached to each other by a clamping unit at the top and clamping unit at the bottom of the pair of server blades.

13. The system of claim 12, wherein installation of the pair of server blades within the system comprises sliding the pair of server blades over the cold blade and tightening the pair of server blades around the cold blade via the clamping units.

14. The system of claim 1, wherein the cold blades are clamped on each side of the at least one server blade.

* * * * *